(12) United States Patent
Xu et al.

(10) Patent No.: US 12,057,814 B2
(45) Date of Patent: Aug. 6, 2024

(54) MULTIPLE FEEDBACK FILTER

(71) Applicant: TEXAS INSTRUMENTS INCORPORATED, Dallas, TX (US)

(72) Inventors: Yang Xu, Allen, TX (US); William Bright, Allen, TX (US); Hasibur Rahman, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 59 days.

(21) Appl. No.: 17/880,142

(22) Filed: Aug. 3, 2022

(65) Prior Publication Data
US 2022/0385244 A1 Dec. 1, 2022

Related U.S. Application Data

(62) Division of application No. 17/124,785, filed on Dec. 17, 2020, now Pat. No. 11,444,587.

(51) Int. Cl.
*H03F 3/04* (2006.01)
*H03F 1/34* (2006.01)

(52) U.S. Cl.
CPC ......... *H03F 3/04* (2013.01); *H03F 2200/129* (2013.01); *H03F 2200/165* (2013.01)

(58) Field of Classification Search
CPC ............... H03F 3/04; H03F 2200/129; H03F 2200/165; H03F 2203/45526; H03F 3/45475; H03H 11/12; H03H 11/1286; H03H 11/126

USPC ............... 330/291, 310, 69, 107–109
See application file for complete search history.

(56) References Cited

U.S. PATENT DOCUMENTS

| | | | |
|---|---|---|---|
| 4,275,453 A * | 6/1981 | Wagner | H03H 11/1217 330/306 |
| 5,999,042 A | 12/1999 | Hemdal et al. | |
| 6,201,442 B1 * | 3/2001 | James | H03F 1/083 330/98 |
| 6,816,004 B2 | 11/2004 | Easwaran et al. | |
| 7,132,881 B2 | 11/2006 | Adan | |
| 8,120,417 B2 | 2/2012 | Kannan et al. | |

* cited by examiner

*Primary Examiner* — Hieu P Nguyen
(74) *Attorney, Agent, or Firm* — Valerie M. Davis; Frank D. Cimino

(57) ABSTRACT

A circuit having an input and an output, the circuit comprising: a first amplifier having a first input, a second input and an output coupled to the output of the circuit; a first capacitor having a first terminal coupled to the first input of the first amplifier and a second terminal coupled to the output of the first amplifier; a first resistor having a first terminal coupled to the first input of the first amplifier and a second terminal; a buffer having an output coupled to the second terminal of the first resistor and an input; a second resistor having a first terminal coupled to the output of the first amplifier and a second terminal coupled to the input of the buffer; a second capacitor coupled between the input of the buffer and ground; and a third resistor coupled between the input of the buffer and the input of the circuit.

11 Claims, 2 Drawing Sheets

MULTIPLE FEEDBACK FILTER

CROSS-REFERENCE TO RELATED APPLICATIONS

This divisional application claims the benefit of priority to U.S. patent application Ser. No. 17/124,785, filed Dec. 17, 2020, which is incorporated herein by reference in its entirety.

BACKGROUND

Electronic devices, such as personal electronic devices, robots, electric cars, industrial equipment, medical equipment and wearable devices, utilize filters to attenuate undesired signals, such as interferers. Basically, "analog filters" operate in the frequency domain and attenuate frequencies that are "out of band". For example, low-pass filters attenuate frequencies above a certain frequency and pass frequencies (for example with little to no attenuation) below that certain frequency. The band of frequencies that are passed through the filter with little to no attenuation is referred to as the "pass band". Other types of "analog filters" includes band-pass filters (where frequencies above and below a certain pass band are attenuated), high-pass filters (where frequencies below a certain frequency are attenuated) and band-stop filters (where frequencies in a certain band are attenuated). The band-stop filters are also referred to as notch filters.

Each of these analog filters may be implemented using only passive components, such as resistors, capacitors and/or inductors, or a mixture of active components, such as amplifiers (e.g. operational amplifiers) and/or transistors, and passive components. Both passive and active filters may have issues with pass band characteristics (e.g. how flat is the pass band, is the pass band too attenuated, does the pass band cover a sufficient frequency band); out-of-band characteristics (does the filter sufficiently attenuate out-of-band frequencies, especially those close to the pass band); and characteristics of the components used to implement the filter (are large capacitors and/or resistors required, are there conditions where the amplifier becomes unstable, is too much power consumed by the filter).

In addition to the above, the quality factor ("Q") of filters that are second order or higher is also an important indicia of the performance of the filter. The quality factor of a filter is an indication of the pass band attenuation/gain, the width of the pass band and the rate in which the magnitude of out-of-band roll-off occurs. For example, a second order low-pass filter with a low Q value will have a slow roll off for frequencies above the cut-off frequency, $f_c$. Whereas a second order low-pass filter with a high Q value will have a steeper roll off but may have a peak at (or near) the cut-off frequency.

SUMMARY

An example embodiment includes a circuit having an input and an output, the circuit comprising: a first amplifier having a first input, a second input and an output coupled to the output of the circuit; a first capacitor having a first terminal coupled to the first input of the first amplifier and a second terminal coupled to the output of the first amplifier; a first resistor having a first terminal coupled to the first input of the first amplifier and a second terminal; a buffer having an output coupled to the second terminal of the first resistor and an input; a second resistor having a first terminal coupled to the output of the first amplifier and a second terminal coupled to the input of the buffer; a second capacitor coupled between the input of the buffer and ground; and a third resistor coupled between the input of the buffer and the input of the circuit. In an example embodiment, the circuit is a low-pass filter. The second input of the first amplifier is coupled to a reference voltage. The first capacitor has a first capacitance value and the second capacitor has a second capacitance value that can be substantially equal to or different from the first capacitance value. In an alternative example embodiment, the buffer includes a second amplifier having a first input connected to the second terminal of the second resistor, a second input and an output connected to the second input and to the second terminal of the first resistor.

An alternative embodiment includes a circuit having an input and an output, the circuit comprising: a first amplifier having a first input, a second input and an output coupled to the output of the circuit; a first capacitor having a first terminal coupled to the first input of the first amplifier and a second terminal coupled to the output of the first amplifier; a first resistor having a first terminal coupled to the first input of the first amplifier and a second terminal; a second amplifier having a first input, a second input and an output connected to the second input and to the second terminal of the first resistor; a second resistor having a first terminal coupled to the output of the first amplifier and a second terminal coupled to the first input of the second amplifier; a second capacitor coupled between the first input of the second amplifier and ground; and a third resistor coupled between the first input of the second amplifier and the input of the circuit. The circuit is a low-pass filter, and the second input of the first amplifier is coupled to a reference voltage. The first capacitor has a first capacitance value and the second capacitor has a second capacitance value that can be substantially equal to or different from the first capacitance value.

Another alternative embodiment includes a circuit having an input and an output, the circuit comprising: a first amplifier having a first input, a second input and an output coupled to the output of the circuit; a first super source follower (SSF) circuit having an input connected to a reference voltage and an output connected to the second input of the first amplifier; a first capacitor having a first terminal coupled to the first input of the first amplifier and a second terminal coupled to the output of the first amplifier; a first resistor having a first terminal coupled to the first input of the first amplifier and a second terminal; a second SSF circuit having an input and an output connected to the second terminal of the first resistor; a second resistor having a first terminal coupled to the output of the first amplifier and a second terminal coupled to the input of the second SSF circuit; a second capacitor coupled between the input of the second SSF circuit and ground; and a third resistor coupled between the input of the second SSF circuit and the input of the circuit. The circuit is a low-pass filter, the first capacitor has a first capacitance value and the second capacitor has a second capacitance value that can be substantially equal to or different from the first capacitance value. In another alternative embodiment, the second SSF circuit includes: a first transistor having a first control terminal connected to the input of the second SSF circuit, a first current terminal and a second current terminal; a second transistor having a second control terminal connected to the first current terminal, a third current terminal connected to a first supply rail and a fourth current terminal connected to the second current terminal and the output of the second SSF circuit; a first current source connected between the second current terminal and a second supply rail; and a second current source connected between the first supply rail and the first current terminal. The first transistor is an nMOSFET, and the second transistor is a pMOSFET. The second supply rail is ground.

BRIEF DESCRIPTION OF THE DRAWINGS

For a detailed description of various examples, reference will now be made to the accompanying drawings in which.

Features with the same reference numeral or identifier are intended to be similar features.

DETAILED DESCRIPTION

An example embodiment includes a multiple feedback ("MFB") filter that is less sensitive to component variations and/or size than a conventional filter. Some example embodiments also include a buffer or super source follower ("SSF") coupled to one or both inputs of an amplifier used in the filter. In some example embodiments, the filter is a MFB filter, which is a second order low-pass filter.

Figure 1:
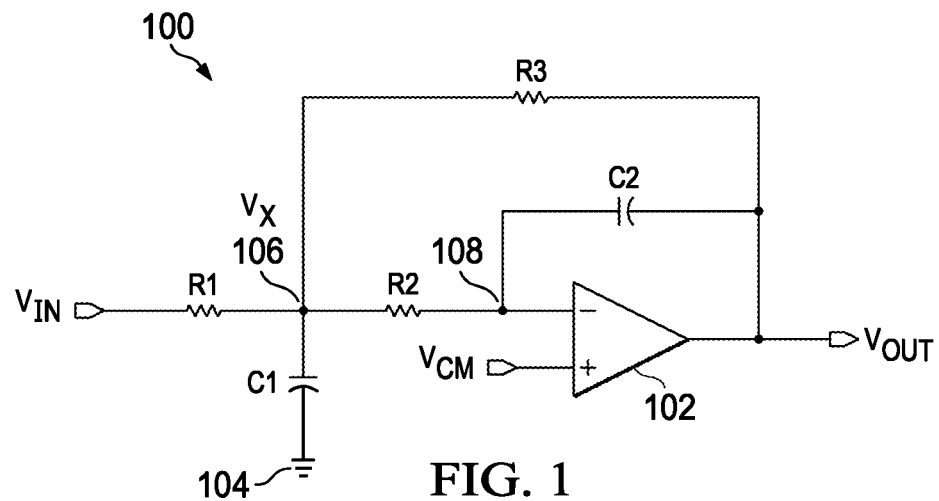
FIG. 1 is a schematic diagram of a filter of an example embodiment.

Referring to FIG. 1, low-pass filter 100 is a second order MFB filter that uses resistors $R_1$, $R_2$ and $R_3$, capacitors $C_1$ and $C_2$ and amplifier 102. Resistor $R_1$ is connected between the input signal, $V_{IN}$, and node 106. The voltage at node 106 is $V_X$. Resistor $R_2$ is connected between node 106 and the inverting (also referred to as the "negative") input (node 108) of amplifier 102. The non-inverting (also referred to as the "positive") input of amplifier 102 is connected to reference voltage $V_{CM}$ (also referred to as the common mode voltage), and the output of amplifier 102 provides the output ($V_{OUT}$) of filter 100. Capacitor $C_1$ is connected between node 106 and ground 104, and capacitor $C_2$ is connected between the inverting input (node 108) of amplifier 102 and the output of amplifier 102. Resistor $R_3$ is connected between node 106 and the output of amplifier 102.

In operation, filter 100 filters $V_{IN}$ so that the higher frequency components of $V_{IN}$ are attenuated at $V_{OUT}$. The transfer function of filter 100 is provided by:

$$\frac{V_{OUT}}{V_{IN}} = -\frac{\frac{G_1}{G_3}}{s^2 \frac{C_1 C_2}{G_2 G_3} + s \frac{C_2(G_1 + G_2 + G_3)}{G_2 G_3} + 1} \quad (1)$$

where $G_1=1/R_1$, $G_2=1/R_2$ and $G_3=1/R_3$. The DC gain, A; pole frequency, $\omega_o$; and the quality factor, Q, for filter 100 can be calculated using equations (2).

$$A = G_1/G_3 \quad (2)$$

$$\omega_o = \sqrt{\frac{G_2 G_3}{C_1 C_2}}$$

$$Q = \frac{\sqrt{G_2 G_3}}{G_1 + G_2 + G_3} \cdot \sqrt{\frac{C_1}{C_2}}$$

As is shown below in equation (3), the value for the quality factor for filter 100 is limited by the ratio of capacitors $C_1$ to $C_2$, regardless of the ratio of resistors $G_2$ to $G_3$.

$$Q = \quad (3)$$

$$\frac{\sqrt{\frac{G_2}{G_3}}}{\frac{G_1}{G_3} + \frac{G_2}{G_3} + 1} \cdot \sqrt{\frac{C_1}{C_2}} \xrightarrow{x = \sqrt{\frac{G_2}{G_3}}} \frac{x}{(A+1) + x^2} \cdot \sqrt{\frac{C_1}{C_2}} \le \frac{1}{2\sqrt{A+1}} \sqrt{\frac{C_1}{C_2}}$$

In order to implement filter 100 with the desired quality factor (especially sufficiently high Q), there must be a requirement on the minimum value for the ratio of capacitors $C_1$ to $C_2$, given by:

$$\frac{C_1}{C_2} \ge 4(A+1)Q^2 \quad (4)$$

As is apparent from equation (4), for a low quality factor (Q<1), the size of capacitors $C_1$ and $C_2$ can be modest (which is easily implemented). However, in order to realize a sufficiently high quality factor (e.g. Q>1), the capacitance (and, along with that, the size) of capacitor $C_1$ should be quite high. For example, according to equation (4), for a quality factor (Q) of 2.5 and a filter DC gain (A) of 1, the ratio of capacitors $C_1$ to $C_2$ would be greater than 50. Therefore, if $C_2$ was 0.5 pF, the minimum capacitance value for $C_1$ would be greater than 25 pF. A capacitor this large would require a lot of active area if it was implemented in a semiconductor device. Hence, this size of capacitor is difficult to implement using standard semiconductor processing and device structures.

Figure 2:
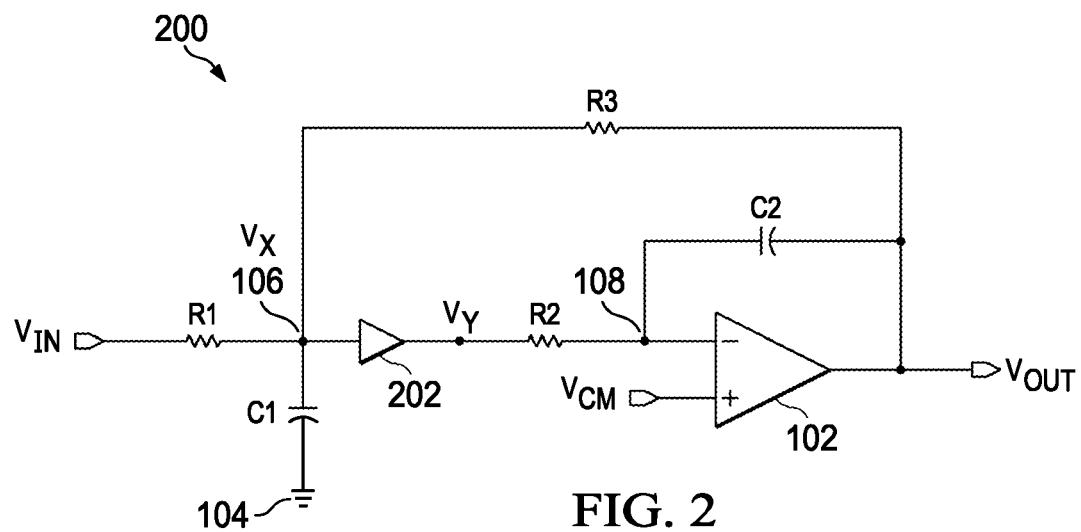
FIG. 2 is a schematic diagram of a filter of an example embodiment that utilizes a buffer.

Referring to FIG. 2, in another example embodiment a buffer (e.g. a voltage buffer or a unity gain amplifier) is added to low-pass filter 100 to form low-pass filter 200 (e.g. a second-order low-pass filter). The input (signal, $V_X$) of buffer 202 is connected to node 106 and the output (signal, $V_Y$) of buffer 202 is connected to the inverting input (node 108) of amplifier 102 through resistor $R_2$. The transfer function of filter 200 is:

$$\frac{V_{OUT}}{V_{IN}} = -\frac{\frac{G_1}{G_3}}{s^2 \frac{C_1 C_2}{G_2 G_3} + s \frac{C_2(G_1 + G_3)}{G_2 G_3} + 1} \quad (5)$$

where $G_1=1/R_1$, $G_2=1/R_2$ and $G_3=1/R_3$. Compared to the transfer function of filter 100 in equation (1), only the 's' term in the denominator is changed. The DC gain, A; pole frequency ($\omega_o=2\pi f_o$); and the quality factor, Q, for filter 200 are provided below in equations (6):

$$A = G_1/G_3 \quad (6)$$

$$\omega_0 = \sqrt{\frac{G_2 G_3}{C_1 C_2}}$$

$$Q = \frac{\sqrt{G_2 G_3}}{G_1 + G_3} \cdot \sqrt{\frac{C_1}{C_2}}$$

The DC gain and the pole frequency equations for filter 200 are the same as the DC gain and pole frequency equations for filter 100 (equation (2)). However, with the addition of buffer 202 the equation for the quality factor for filter 200 is different than the equation for the quality factor for filter 100. Specifically, since little to no current flows into the input of buffer 202, the portion of the transfer function relating to current through resistor $R_2$ (i.e. $G_2*V_X$) is eliminated in Kirchhoff's Current Law equation at node 106, and, hence, in the 's' term of the denominator of equation (5) $C_2$ is multiplied by $(G_1+G_3)$ instead of $(G_1+G_2+G_3)$. According to equation (6) for the quality factor for filter 200, there is no constraint between the achievable quality factor Q and the ratio of capacitors $C_1$ to $C_2$. Therefore, the ratio of capacitors $C_1$ to $C_2$ can be flexibly chosen (as small as just 1) in filter 200, and the desired Q is realized with appropriate value for the ratio of resistors $G_2$ to $G_3$. For example, where the quality factor (Q) is around 2.5 and the DC gain (A) is 1, the ratio of $C_1$ to $C_2$ is greater than around 50 for filter 100 but can be chosen to be 1 for filter 200. Hence, if a 0.5 pF capacitor is used for $C_2$ then $C_1$ would need to be greater than 25 pF for filter 100 but only around 0.5 pF for filter 200. The total capacitance size of capacitors $C_1$ and $C_2$ for filter 200 is reduced compared to that for filter 100, which results in a significant reduction of active area if implemented in a semiconductor device.

In another example embodiment, equations (7), (8) and (9) are used to determine the values of resistors $R_1$, $R_2$ and $R_3$ for filter 200, respectively.

$$G_1 = \frac{Ar\omega_o C_2}{(A+1)Q} \quad (7)$$

$$G_2 = (A+1)Q\omega_o C_2 \quad (8)$$

$$G_3 = \frac{r\omega_o C_2}{(A+1)Q} \quad (9)$$

where $r=C_1/C_2$. For example, in an example embodiment where the DC gain (A) is 1, the quality factor (Q) is around 2.5, the pole frequency ($\omega_o$) is around 52 MHz, and $C_1$ and $C_2$ are 0.5 pF (as stated above): $R_1$ is around 31 kΩ, $R_2$ is around 1.2 kΩ and $R_3$ is around 31 kΩ.

The transfer function of $V_X$ to $V_{IN}$ for filter 200 is shown in equation (10).

$$\frac{V_X}{V_{IN}} = \frac{s \frac{C_2 G_1}{G_2 G_3}}{s^2 \frac{C_1 C_2}{G_2 G_3} + s \frac{C_2(G_1 + G_3)}{G_2 G_3} + 1} \quad (10)$$

Equation (10) illustrates that the peak gain for filter 200 occurs at the pole frequency, $\omega_o$. The peak gain is shown in equation (11).

$$\frac{V_X}{V_{IN}} @ \omega_o = \frac{G_1}{G_1 + G_3} = \frac{A}{A+1} \quad (11)$$

Based on equations (10) and (11), the voltage at node 106 of filter 200 should not appreciably vary with respect to $V_{IN}$.

Figure 3A:
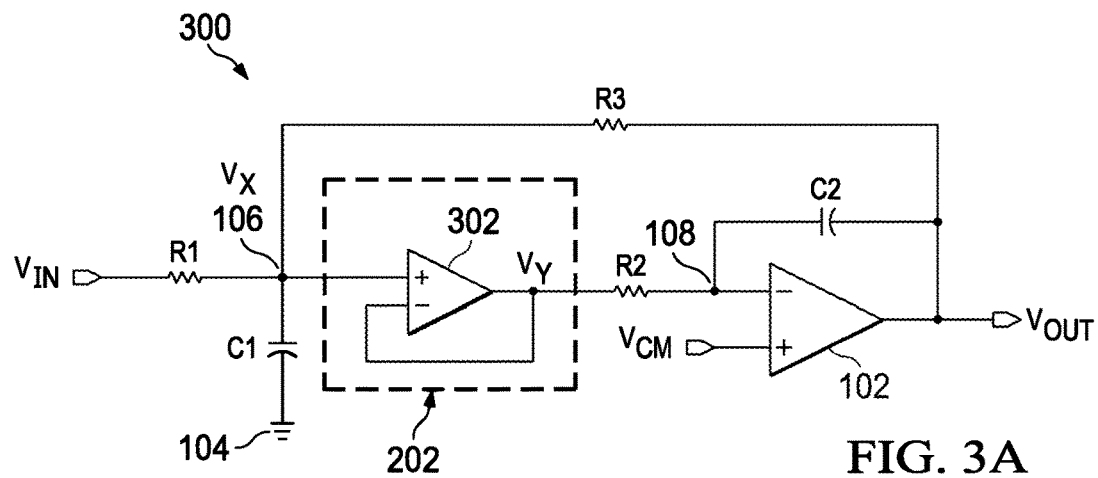
FIG. 3A and FIG. 3B are schematic diagrams of a filter of an example embodiment that utilizes different example buffers.
Figure 3B:
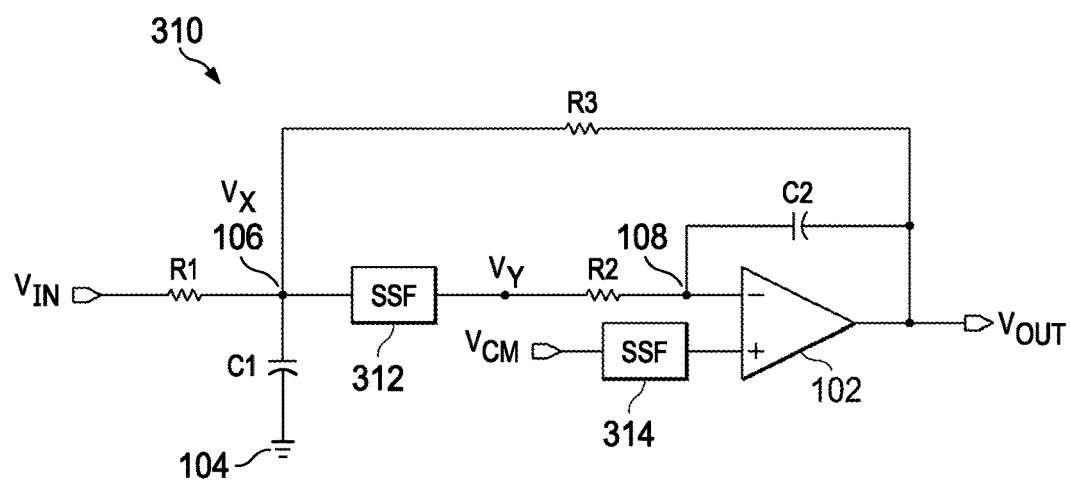

FIGS. 3A and 3B illustrate example implementations of the example embodiment of FIG. 2. Specifically, filter 300 of FIG. 3A utilizes an amplifier 302 (e.g. an operation amplifier) with the output of amplifier 302 connected to the inverting input of amplifier 302 in place of buffer 202. Filter 310 of FIG. 3B utilizes one or more (two are shown in the example embodiment of FIG. 3B) super source follower ("SSF") circuits. In the example embodiment of FIG. 3B, an SSF 312 is connected between node 106 and resistor $R_2$. Since a voltage shift may occur between the input of SSF 312 and the output of SSF 312 (hence a shift in voltage of $V_Y$ with respect to $V_X$), an additional SSF may be connected to the non-inverting input of amplifier 102 in this example embodiment to account for this voltage shift. Specifically, SSF 314 (which may or may not be the same as SSF 312 in sizing of transistors and bias currents) is connected between reference voltage source $V_{CM}$ and the non-inverting input of amplifier 102. The transfer functions of filters 300 and 310 should be the same as shown in equations (5).

Figure 3C:
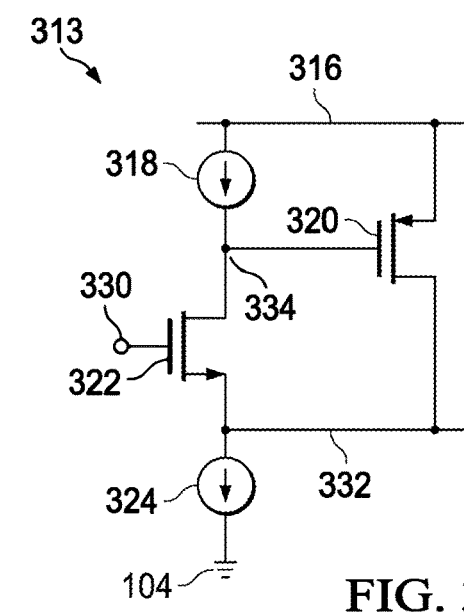
FIG. 3C is a schematic diagram of a super source follower of an example embodiment.

FIG. 3C illustrates an example implementation of SSF 312 and SSF 314. Node 330 of SSF 313 may be connected to node 106 for SSF 312 or $V_{CM}$ for SSF 314. Node 332 of SSF 313 may be connected to resistor $R_2$ for SSF 312 or the non-inverting input of amplifier 102 for SSF 314. SSF 313 includes transistors 322 and 320. The gate of transistor 322 is connected to node 330, the source is connected to node 332 and to ground 104 through current source 324 and the drain is connected to node 334 and to voltage supply 316 through current source 318. The gate of transistor 320 is connected to node 334. The source of transistor 320 is connected to voltage supply 316 and the drain is connected to node 332. While transistors 320 and 322 are shown in FIG. 3C as metal-oxide-silicon field-effect transistors ("MOSFETs"), transistors 320 and/or 322 can be bipolar junction transistors, junction field-effect transistors or other type of transistor. In addition, transistors 320 is shown as a pMOSFET but it can be n-type, and transistor 322 is shown to be an nMOSFET but it can be p-type.

While the capacitors of low-pass filters 200, 300 and 310 can be smaller (both in terms of capacitance values and physical size) than those used in low-pass filter 100, these filters, in some example embodiments, may consume less power than low-pass filter 100. If amplifier 102 was ideal, it would have an infinite gain-bandwidth product ("GBW"). However, if amplifier 102 is not ideal, it will have a finite GBW. If the GBW of the amplifier used in the filter is lower, the performance of the filter suffers. Specifically, the filter magnitude response (filtering characteristic) is changed from the ideal filter transfer function if the amplifier GBW is lower. To maintain the magnitude response of the filter in these instances, greater power is consumed by the filter, as higher amplifier GBW corresponds to higher power consumption in amplifier 102. Since filters 200, 300 and 310 are impacted less by the GBW of the amplifier 102 (as compared to filter 100), namely, to maintain the same degradation of filter magnitude response from the ideal at an acceptable level, the amplifier GBW requirement in these filters 200, 300 and 310 is significantly reduced to around half of that in filter 100, therefore these filters require less power (maybe as little as half the power as required in filter 100).

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "approximately" preceding a value means +/−10 percent of the stated value. As used herein, the term "modulate" shall also mean "to vary" or "to change." The terms "node", "terminal", "pin" and "interconnection", for example, are interchangeably used and referred to any connection (or interconnection) between features. These terms are not meant to be limiting with respect to a certain type of physical structure. For example, the "terminals" of a circuit element are meant to be each connection to such circuit element. Hence, an integrated resistor would be referred to have two terminals (ends) even though these "terminals" are just the two connections to the integrated resistor.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A circuit having an input and an output, the circuit comprising:
   a first amplifier having a first input, a second input and an output coupled to the output of the circuit;
   a first capacitor having a first terminal coupled to the first input of the first amplifier and a second terminal coupled to the output of the first amplifier;
   a first resistor having a first terminal coupled to the first input of the first amplifier and a second terminal;
   a second amplifier having a first input, a second input and an output, in which the output of the second amplifier is connected only to the second input of the second amplifier and to the second terminal of the first resistor;
   a second resistor having a first terminal coupled to the output of the first amplifier and a second terminal coupled to the first input of the second amplifier;
   a second capacitor coupled between the first input of the second amplifier and ground; and
   a third resistor coupled between the first input of the second amplifier and the input of the circuit.

2. The circuit of claim 1, wherein the circuit is a low-pass filter.

3. The circuit of claim 1, wherein the second input of the first amplifier is coupled to a reference voltage.

4. The circuit of claim 1, wherein the first capacitor has a first capacitance value and the second capacitor has a second capacitance value that is substantially equal to the first capacitance value.

5. A circuit having an input and an output, the circuit comprising:
   a first amplifier having a first input, a second input and an output coupled to the output of the circuit;
   a first source follower (SF) circuit having an input connected to a reference voltage and an output connected to the second input of the first amplifier;
   a first capacitor having a first terminal coupled to the first input of the first amplifier and a second terminal coupled to the output of the first amplifier;
   a first resistor having a first terminal coupled to the first input of the first amplifier and a second terminal;
   a second SF circuit having an input and an output connected to the second terminal of the first resistor;
   a second resistor having a first terminal coupled to the output of the first amplifier and a second terminal coupled to the input of the second SF circuit;
   a second capacitor coupled between the input of the second SF circuit and ground; and
   a third resistor coupled between the input of the second SF circuit and the input of the circuit.

6. The circuit of claim 5, wherein the circuit is a low-pass filter.

7. The circuit of claim 5, wherein the first capacitor has a first capacitance value and the second capacitor has a second capacitance value that is substantially equal to the first capacitance value.

8. The circuit of claim 5, wherein the second SF circuit includes:
   a first transistor having a first control terminal connected to the input of the second SF circuit, a first current terminal and a second current terminal;
   a second transistor having a second control terminal connected to the first current terminal, a third current terminal connected to a first supply rail and a fourth current terminal connected to the second current terminal and the output of the second SF circuit;
   a first current source connected between the second current terminal and a second supply rail; and
   a second current source connected between the first supply rail and the first current terminal.

9. The circuit of claim 8, wherein the first transistor is an nMOSFET.

10. The circuit of claim 8, wherein the second transistor is a pMOSFET.

11. The circuit of claim 8, wherein the second supply rail is ground.

* * * * *